(12) United States Patent
Akulova et al.

(10) Patent No.: US 6,795,472 B2
(45) Date of Patent: Sep. 21, 2004

(54) LASER WITH A RESONANT OPTICAL REFLECTOR

(75) Inventors: Yuliya Anatolyevna Akulova, Goleta, CA (US); Rudolf Feodor Kazarinov, Lubbock, TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 242 days.

(21) Appl. No.: 10/067,670

(22) Filed: Feb. 5, 2002

(65) Prior Publication Data

US 2003/0147441 A1 Aug. 7, 2003

(51) Int. Cl.$^7$ .............................................. H01S 5/00
(52) U.S. Cl. ............................ 372/50; 372/43; 372/45; 372/46; 372/96
(58) Field of Search .............................. 372/50, 45, 46, 372/96

(56) References Cited

U.S. PATENT DOCUMENTS

| | | | |
|---|---|---|---|
| 4,852,960 A | * | 8/1989 | Alferness et al. ............. 385/37 |
| 5,001,720 A | * | 3/1991 | Ackerman et al. ............ 372/50 |
| 5,048,909 A | | 9/1991 | Henry et al. .................. 385/27 |
| 5,145,792 A | * | 9/1992 | Hirata ........................... 438/36 |
| 5,715,271 A | * | 2/1998 | Huang et al. ................ 372/102 |
| 5,915,051 A | * | 6/1999 | Damask et al. ............... 385/16 |
| 6,162,655 A | | 12/2000 | Johnson ........................ 438/31 |
| 2002/0037025 A1 | * | 3/2002 | Bartman et al. .............. 372/50 |

OTHER PUBLICATIONS

R.F. Kazarinov et al., *Narrow–Band* . . . , IEEE J. Quant. Electr., vol. 23, No. 9, pp. 1419–1425 (Sep. 1987).

L. J. P. Ketelsen et al., *Multiwavelength DFB* . . . , IEEE J. Quant. Electr., vol. 36, No. 6, pp. 641–648 (Jun. 2000).

\* cited by examiner

*Primary Examiner*—Don Wong
*Assistant Examiner*—Dung (Michael) T Nguyen

(57) ABSTRACT

A laser includes an optical cavity resonator having first and second reflectors and an active region interposed between the reflectors. The second reflector includes a resonant optical reflector having an optical gain medium.

11 Claims, 2 Drawing Sheets

LASER WITH A RESONANT OPTICAL REFLECTOR

BACKGROUND OF THE INVENTION

1. Field of the Invention

This invention relates to semiconductor lasers.

2. Discussion of the Related Art

For many laser applications, a narrow band and time-stable output wavelength is required. This requirement is especially important in modern wavelength division multiplexed (WDM) systems in which several adjacent and narrow wavelength channels carry independent communications. In a WDM system, a small drift in the output wavelength of a laser transmitter can cause a communication to be transmitted in the wrong wavelength channel and be effectively lost.

One narrow band laser is a distributed Bragg reflector (DBR) laser. In a DBR laser, a lasing cavity uses a Bragg grating for one or both of the reflectors of the laser's Fabry-Perot cavity. The Bragg grating functions as a highly wavelength selective reflector. When used as a reflector of a laser cavity, the wavelength selectivity of the Bragg grating causes the laser cavity to lase over much narrower frequency bands than a comparable laser with non-wavelength selective reflectors. Thus, DBR lasers satisfy one of the requirements of WDM systems, i.e., narrow band outputs.

Many semiconductor DBR lasers also incorporate wavelength tunability by adjusting current values passing through the Bragg grating. The current changes the index of refraction of the grating media and thus, the wavelength range that the grating reflects. Thus, by adjusting the tuning current an operator is able to adjust the output wavelength of such a laser, e.g., to cause a laser transmitter to change transmission channel in a DBR network.

Unfortunately, DBR tunable lasers suffer from wavelength instabilities associated with the use of tuning currents to set output wavelengths. One type of instability results from aging of the DBR laser. With use properties of the semiconductor medium of the laser's Bragg reflector change, and the amount of current needed to select a desired output wavelength changes. This age-induced effect is problematic in WDM transmitters and requires a mechanism for adjusting the tuning current in time to avoid channel jumping as the relation between applied tuning current and output wavelength changes. Another type of instability results from the need to use a current to select the wavelength of a DBR laser. A typical current source has fluctuations in its output current, e.g., because of temperature changes. These current fluctuations cause the reflection wavelength of a Bragg grating being tuned by the current to fluctuate, i.e., cause the output wavelength of a DBR laser controlled by the current source to fluctuate. Both instabilities can cause channel jumping when transmitters for WDM networks use tunable DBR lasers.

BRIEF SUMMARY OF THE INVENTION

Various embodiments of our invention provide narrow band lasers with wavelength-stabilized outputs. The outputs are typically more stable than those of conventional DBR lasers, because the output wavelengths are fixed by the properties of a resonant optical cavity whose resonant wavelength is at most weakly regulated by currents passing therethrough.

In one aspect, the invention features a laser that includes an optical cavity with first and second reflectors and an optical gain medium interposed between the reflectors. The second reflector is a resonant optical reflector that is pumpable to reduce its loss.

BRIEF DESCRIPTION OF THE SEVERAL VIEWS OF THE DRAWING

Our invention, together with its various features and advantages, can be readily understood from the following more detailed description taken in conjunction with the accompanying drawing, in which.

In the interest of clarity and simplicity, the figures have not been drawn to scale. In addition, in the figures like reference numbers indicate functionally equivalent features.

DETAILED DESCRIPTION OF THE INVENTION

Figure 1:
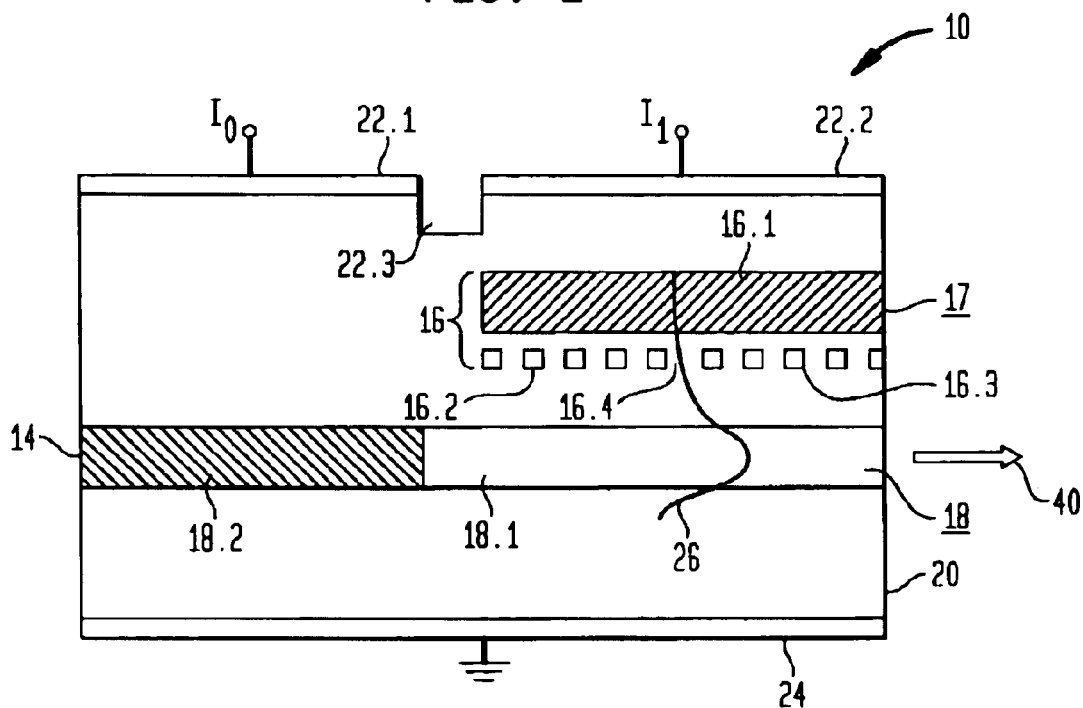
FIG. 1 is a schematic side view of a laser with a pumpable resonant optical reflector (ROR) in accordance with an illustrative embodiment of our invention.

FIG. 1 schematically illustrates a monolithic semiconductor laser 10 in accordance with an illustrative embodiment of our invention. The laser 10 includes a cavity resonator that is closed at opposite ends by reflectors. In one embodiment the cavity resonator is closed at one end by a simple reflector 14 (e.g., a highly reflective crystal facet) and at a second end by a pumpable resonant optical reflector (ROR) 16. Alternatively, the cavity resonator could be closed at one end by a well-known Bragg reflector and at the other end by a ROR. Laser 10 lases only at a wavelength for which light intensity builds up in ROR 16. Only for such a wavelength does the ROR 16 provide enough optical feedback to the cavity resonator to sustain lasing therein via stimulated emission.

A ROR is a wavelength-selective reflector that has a narrowband reflection spectrum. RORs in general are well-known in the art and are described, for example, by R. F. Kazarinov et al., in IEEE J. Quantum Electr., Vol. QE-23, No. 9, pp. 1419–1425 (1987) and R. C. Alferness et al., U.S. Pat. No. 4,852,960 (1989), both of which are incorporated herein by reference. Typically an ROR includes a pair of optically coupled, single mode waveguides and, located in one of the waveguides, a pair of (preferably) first-order Bragg gratings 16.2 and 16.3 separated by a quarter-wavelength phase shift section 16.4, as shown in FIG. 1.

In accordance with one aspect of our invention, however, the ROR 16 is modified to include a gain region 16.1 that generates optical gain over a spectrum of optical wavelengths when suitably pumped; e.g., either electrically via an electric current $I_1$ applied thereto (under forward bias applied across contacts 22.2 and 24) or via on optical pump signal absorbed therein (not shown). The ROR is designed to be highly reflective at a predetermined wavelength within the gain spectrum of the active region 18.2. When the ROR is pumped, the amount of gain produced should be sufficient to overcome or compensate for all, or nearly all, of the internal optical loss associated with the ROR. Then the laser will lase at the design wavelength of the ROR. In a preferred embodiment, the ROR is pumped to the transparency point of its gain region 16.1. At this point, the gain of the ROR just matches its loss, and the reflection of the ROR is essentially unity. In contrast, the ROR should not be pumped too far below this point, otherwise the ROR may be too lossy and its reflection peak may become too broad and/or too low. On the other hand, the ROR should also not be pumped too far above the transparency point, otherwise the ROR itself might lase causing unwanted interference with, or coupling to, the stimulated emission generated by active region 18.2. Of course, pumping above the transparency point also means that the current (or optical pump) applied to the ROR is relatively high and might cause deleterious heating.

In one embodiment, laser 10 includes a pair of weakly coupled waveguides. One waveguide 18 includes the laser active region 18.2 and a passive section 18.1, which are optically coupled to one another; e.g., by well-know butt coupling or taper coupling techniques. The other waveguide 17 includes the ROR gain region 16.1. These waveguides may be vertically displaced from one another as shown in the side view of FIG. 1 herein, or may be laterally displaced from one another as shown in the top view of FIG. 1 of both the Kazarinov paper and the Alferness patent, supra. In either case, the ROR 16 is weakly coupled to the active region 18.2 of the laser 10 in the following sense; that is, the evanescent field of the optical mode 26 of the radiation generated in the active region penetrates only slightly into the ROR 16, and the peak portion of the mode overlaps the lower waveguide 18.

When the active region 18.2 is pumped above its lasing threshold, the laser 10 generates stimulated, coherent radiation that emerges illustratively as output beam 40 from the right hand end of passive waveguide 18.1 at surface 20. To this end, surface 20 preferably has an anti-reflection (AR) coating thereon, whereas the opposite left hand end of waveguide 18 at surface 14 preferably has a high-reflectivity (HR) coating thereon. When the gain region 16.1 is also pumped sufficiently to overcome the internal optical loss associated with the ROR, the output beam 40 has a very narrow band, single mode spectrum with its center wavelength $\lambda_1$ determined by the design of the ROR's (preferably) first order Bragg grating. On the other hand, when the gain region 16.1 is not pumped, or is insufficiently pumped, then the ROR provides insufficient feedback to the active region, and the output beam constitutes guided, amplified stimulated emission; i.e., its spectrum is essentially that of the laser below its threshold.

Alternatively, the output of laser 10 may be taken the opposite end of waveguide 18, in which case this end of the waveguide would be coated by a suitable AR or other low reflectivity (LR) coating. Thus, outputs can be derived from either end of waveguide 18, or from both ends (using LR coatings on both surfaces 14 and 20, provided that the active region can provide sufficient gain).

When using electric current to pump the active region and the ROR gain region, the top surface of the laser is typically provided with a segmented contacts 22.1 and 22.2 that are electrically isolated from one another, thereby to allow the active region and ROR gain regions to be independently controlled. The contacts may be isolated by any of several techniques that are well known in the art. For example, laser of FIG. 1 utilizes a groove 22.3 that penetrates sufficiently deep into the underlying semiconductor to separate the contacts and to reduce current spreading. Of course, current spreading can also be reduced by decreasing the vertical distance between the contacts and the active and gain regions.

Figure 3:
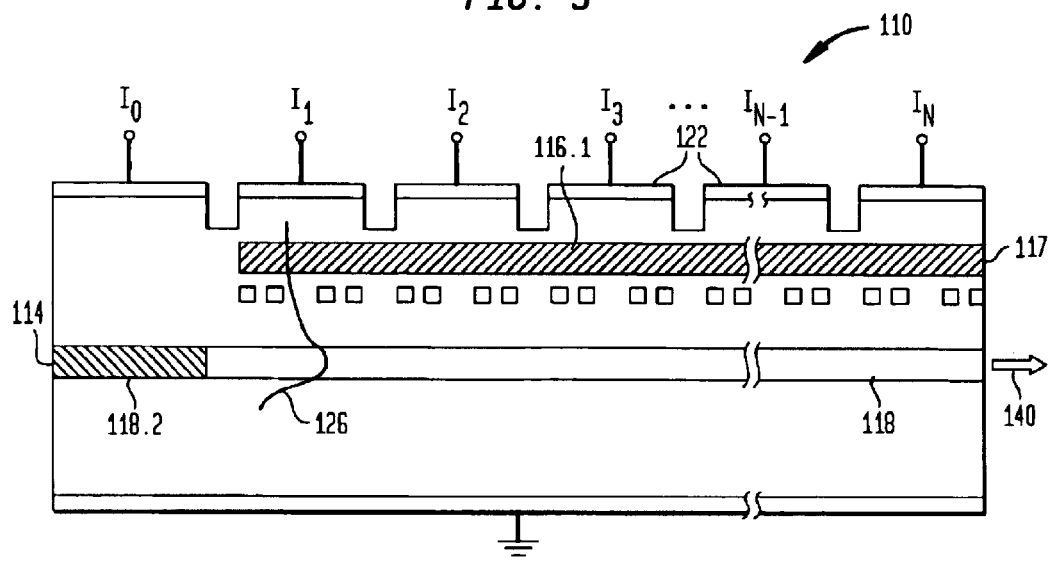
FIG. 3 is a schematic side view of a wavelength-tunable laser with multiple RORs in accordance with another illustrative embodiment of our invention.

An alternative, preferred embodiment of our invention is shown in the side view of FIG. 3. Here the laser 110 is tunable; that is, it is capable of providing a narrow band output beam 140 at any one (or more) of N different wavelengths. This functionality is realized, as before, by a pair of weakly coupled waveguides 117 and 118, with the latter including the laser active region 118.2 and the former including a ROR gain region 116.1. In this case, however, a multiplicity N of RORs is associated with waveguide 117. Each of the RORs includes a (preferably) first-order Bragg grating that underlies a separate one of a like multiplicity of segmented, electrically isolated contacts. A similar contact is provided for pumping the active region 118.2. Each of the gratings is designed to be highly reflective at a different resonant wavelength within the gain spectrum of the active region 118.2. However, the output beam includes only those wavelengths of RORs that are pumped under forward bias by current $I_k$ (k=1, 2 ... N) that is sufficient to overcome the internal optical loss associated with the pumped RORs. For example, if the active region and only the first ROR are pumped (by current $I_1$), then the output beam is a narrow band spectrum with its center wavelength at $\lambda_1$. Similarly, if the active region and only the third ROR are pumped (by current $I_3$), then the output beam is a narrow band spectrum with its center wavelength at $\lambda_3$. In contrast, if the active region and both the first and third RORs are pumped (separately by currents $I_1$ and $I_3$), then the output beam includes components at both $\lambda_1$ and $\lambda_3$.

In one embodiment, the laser 110 has a mesa geometry (e.g., a ridge waveguide structure) with the mesa extending along the longitudinal axis of the laser. The various contacts 122 and associated isolation grooves would be formed on/in the top of the mesa. Such a laser with a length of only about 4 mm is capable of being tuned to ten different wavelengths without the need for temperature tuning. Of course, temperature tuning could be utilized in conjunction with this or any other embodiment of our invention, if so desired.

Theory of Operation

Figure 2:
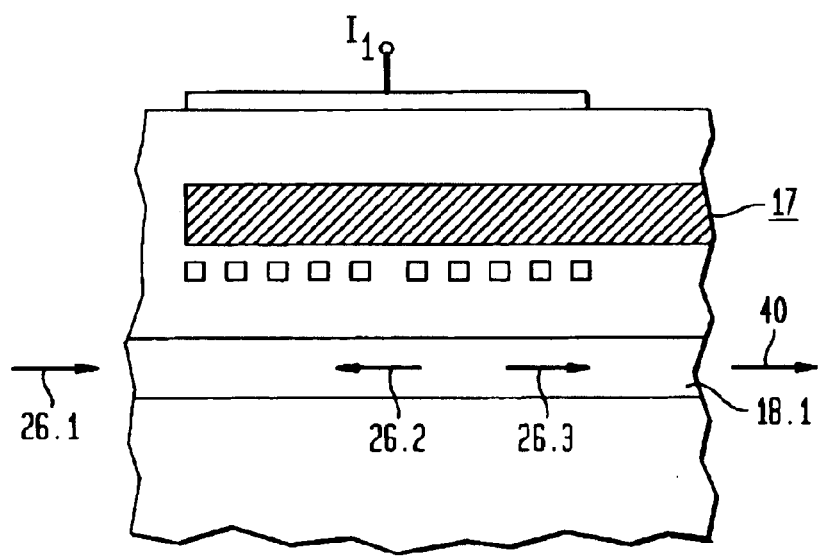
FIG. 2 illustrates an ROR for purposes of understanding the theory of operation of our invention.

In order to explain how radiation (light) propagating in the passive waveguide is reflected from the ROR in the upper waveguide that is weakly coupled thereto, consider first the laser of FIG. 1 under the condition that the ROR is forward biased and the applied current $I_1$ generates sufficient gain to overcome the internal optical loss associated with the ROR. As shown in FIG. 2, for an incident electromagnetic field 26.1 in the passive waveguide 18.1 at the resonant frequency of the ROR, a relatively strong field builds up in the ROR resonator. Energy accumulated in the ROR resonator couples back into the passive waveguide in both directions as shown by arrows 26.2 and 26.3. The reinjected field 26.3 in the forward direction destructively interferes with the incident field 26.1, and at resonance essentially all optical power is reflected back to the gain section of the ROR, provided that the ROR resonator loss is dominated by coupling between the two waveguides. This condition is obtained, in accordance with our invention, by forward biasing the ROR and supplying pump current thereto. In contrast, in the multiple ROR embodiment of FIG. 3, reflection is negligible from other RORs, which are not forward biased and/or are insufficiently pumped. Reflection from an ROR results from reinjection of the optical field accumulated in the ROR resonator back into the passive waveguide, as shown by arrow 26.2 of FIG. 2. Because the unbiased, unpumped RORs of FIG. 3 have relatively high internal loss and weak coupling to the passive waveguide, optical power does not accumulate therein, resulting in low reflection from those RORs. Thus, the operating wavelength of the laser of FIG. 3 is selected by biasing and pumping at least one of the ROR gain regions.

In order to provide relatively high external efficiency of our laser, coupling (δ) between the waveguides should be small, which is achieved by making the propagation constants of the waveguides different from one another by an amount (Δ). In this case power launched into the passive waveguide from the ROR gain section propagates mostly in the passive waveguide, and only a small fraction of it couples into the upper waveguide (and hence into the RORs). A small value of δ allows for high wavelength selectivity.

Illustration

Assume, for example, the laser 110 of FIG. 3 is fabricated from the InP/InGaAsP materials system and has the following characteristics: the waveguides comprise InGaAsP with a photoluminescence inflection wavelength of 1.28 $\mu$m, the upper waveguide 117 is 0.3 $\mu$m thick, the passive waveguide 118 is 0.25 $\mu$m thick, the two waveguides are separated by an InP spacer layer that is 2 $\mu$m thick, and the mesa is 2 $\mu$m wide. Under these circumstances, δ is about 0.03 and Δ is about $2\pi/280$ $\mu m^{-1}$. The resulting width of the reflection spectrum of an ROR is $4\times10^8$ Hz. Such a narrow reflection linewidth is achievable as a direct result of the active compensation of the internal loss of the pumped ROR. Under the condition of resonance the reflection coefficient of the pumped ROR is of the order of unity, whereas that of an unpumped ROR may be as small as about $10^{-2}$.

WDM System

Figure 4:
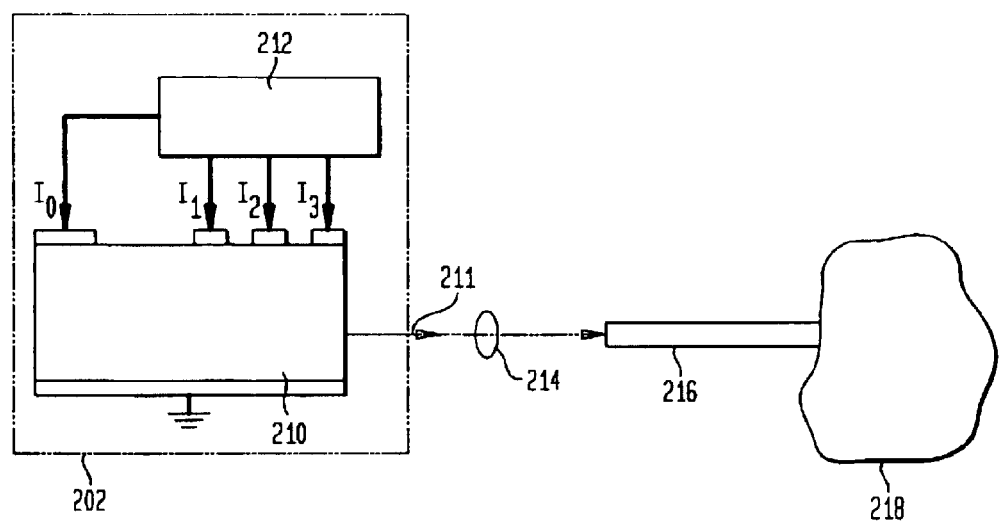
FIG. 4 is a schematic view of a WDM system in which a transmitter uses a laser with multiple RORs in accordance with one embodiment of our invention.

In accordance with another aspect of our invention, a wavelength division multiplexed (WDM) system 200 is schematically shown in FIG. 4. The system comprises a transmitter 202, which includes a tunable laser 210 of the type shown in FIG. 3, and a utilization apparatus 218 optically coupled to one another by a transmission medium 216 and a lens system 214. The transmission medium 216 is typically an optical fiber, but may also be a free-space optical path. The utilization apparatus 218 may be a piece of terminal equipment such as optical receiver or an optical amplifier or an optical modulator, or it may be a portion of a switching system or a transmission system. The lens system 214 may include a single lens or a multiplicity of lenses for focusing the optical beam 211 into the transmission medium 216.

A controller or scheduler 212 supplies the necessary voltage bias and pumping current to the active region ($I_0$) as well as to the various RORs ($I_1, I_2, I_3$). For simplicity, only N=3 RORs are depicted. Fewer or more RORs could be utilized. In addition, the controller 212 could also modulate the laser output by directly modulating the current supplied to the laser active region. Alternatively, the laser could be modulated by an external modulator (not shown) disposed between the laser output and the input to utilization apparatus 218. The form of the modulation may be analog (e.g., AM or FM) or digital (e.g., PCM or packet). In either case, the controller or scheduler determines the wavelength of the output beam 211, and thereby the wavelength of the carrier signals that are to be transmitted over medium 216 to utilization apparatus 218. It also determines when the laser switches from generating one wavelength to another, or whether it generates more than one wavelength simultaneously.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention. In particular, a method of operating our laser includes the steps of (a) pumping the active region of an optical cavity resonator of the laser to produce stimulated optical emission; and (b) pumping the gain region of a resonant optical reflector coupled to one end of the resonator to increase the amount of radiation that the reflector reflects back into the resonator (i.e., to convert the cavity from lossy to non-lossy at the resonant wavelength of the reflector).

We claim:

1. A laser comprising:

an optical cavity resonator having first and second reflectors and an active region interposed between said reflectors; characterized in that the second reflector comprises a resonant optical reflector (ROR) that includes an optical gain medium.

2. The laser of claim 1, wherein the ROR reflects radiation back into the optical cavity in response to being pumped.

3. The laser of claim 2, wherein the ROR is characterized by having cavity losses that attenuate incident radiation in response to not being pumped.

4. The laser of claim 1, wherein the second reflector further comprises a second ROR that includes an optical gain medium; and the first and second RORs resonantly reflect at different wavelengths.

5. The laser of claim 1, further comprising:

a monolithic structure, the reflectors and optical gain medium belonging to the monolithic structure.

6. The laser of claim 2, wherein the optical gain medium of the ROR is pumpable by passing an electric current therethrough.

7. The laser of claim 1, further comprising first and second optical waveguides that are weakly coupled to one another, the active region being disposed in the first waveguide, and the ROR gain medium being disposed in the second waveguide.

8. A tunable semiconductor laser comprising an optical cavity resonator having first and second reflectors and an active region interposed between said reflectors; characterized in that the second reflector comprises a multiplicity of resonant optical reflectors (RORs) each of which includes an optical gain medium and each of which is resonant at a different wavelength, a first optical waveguide that includes the active region, a second optical waveguide that includes the ROR gain media, the second waveguide being weakly coupled to the first waveguide, and means for pumping selected ones of the ROR gain media so that said laser emits radiation at one or more wavelengths corresponding to the selected ROR gain media.

9. The laser of claim 8, wherein the pumping means includes a multiplicity of segmented, electrically isolated electrodes overlaying the second waveguide for applying voltage bias and pumping current to the selected RORs.

10. A WDM system comprising
a transmitter,
a receiver,
a transmission medium coupling the transmitter to the receiver, characterized in that
the transmitter includes a laser according to claim 8.

11. A method of tuning a laser, the laser including an optical cavity resonator formed by a first reflector and a resonant optical reflector (ROR) with an active region disposed in the resonator and a gain medium disposed in the ROR, comprising the steps of:

(a) pumping the active region to produce stimulated optical emission; and (b) pumping the gain region to increase the amount of radiation that the ROR reflects back into the resonator.

* * * * *